United States Patent [19]

Maekawa et al.

[11] 4,442,384
[45] Apr. 10, 1984

[54] HORIZONTAL DEFLECTION CIRCUIT

[75] Inventors: Hitoshi Maekawa; Michitaka Osawa; Kunio Ando, all of Yokohama, Japan

[73] Assignee: Hitachi, Ltd., Tokyo, Japan

[21] Appl. No.: 434,880

[22] Filed: Oct. 18, 1982

[30] Foreign Application Priority Data

Oct. 19, 1981 [JP] Japan .............................. 56-165840
Nov. 9, 1981 [JP] Japan .............................. 56-178381

[51] Int. Cl.³ ........................ H01J 29/70; H01J 29/76
[52] U.S. Cl. ...................................... 315/399; 315/387
[58] Field of Search ........................ 315/399, 408, 387

[56] References Cited

U.S. PATENT DOCUMENTS 3,970,894 7/1976 Yasuda et al. ...................... 315/387

Primary Examiner—Theodore M. Blum
Attorney, Agent, or Firm—Antonelli, Terry & Wands

[57] ABSTRACT

A horizontal deflection circuit comprises a horizontal oscillator circuit, a drive transistor, a horizontal output transistor driven by the output of the drive transistor, a timing circuit for setting a timing delayed by about one fourth the horizontal scanning period from the terminating point of the flyback pulse generated at the collector of the horizontal output transistor, a phase difference detector circuit for detecting the phase difference between the leading edge of the collector pulse of the horizontal drive transistor and the timing set by the timing circuit, and a pulse duration variable output circuit triggered by the output of the horizontal oscillator circuit and with the output pulse duration thereof controlled by the output of the phase difference detector circuit. The horizontal drive transistor is driven by the output of the pulse duration variable output circuit, so that the leading edge of the collector pulse of the horizontal drive transistor is rendered to coincide with the timing set by the timing circuit.

5 Claims, 5 Drawing Figures

HORIZONTAL DEFLECTION CIRCUIT

The present invention relates to a horizontal deflection circuit of a display unit or the like used for a television receiver, a television camera or as a computer terminal.

The storage time of a transistor used for the horizontal deflection circuit, including the variations, is about 5 to 10 μsec for the horizontal drive transistor and about 4 to 8 μsec for the horizontal output transistor.

Even in the same element, this figure undergoes a change of several μsec with the temperature change of about 30° C. Assuming that the period from the end of the flyback pulse to the starting of conduction of the horizontal output transistor is a drive transistor rise margin Tmd, and the period from the starting of conduction of the output transistor to the substantial middle point of the scanning period Ts, namely, the end of the damper current is a current rise margin Tmi, the equations below are obtained.

$$Tmd = Td - (T_{OST} + Tr) \quad (1)$$

$$Tmi = T_{OST} + Tr + Tmd + Tmi - Td \quad (2)$$

where Td is the turned-on time of the drive transistor including the storage time of the horizontal drive transistor, $T_{OST}$ is the storage time of the horizontal output transistor, and Tr is the flyback pulse duration.

The largest margin is secured against the variations of the storage time when Tmd is set equal to Tmi. Nevertheless, the value Tmd is rendered a little larger than Tmi as the former affects the transistor breakage at the time of an abnormal operation, so that Tmd≳Tmi generally. Consider the case in which the horizontal frequency of 15.75 KHz is involved. If Tr is set to 12 μsec (horizontal scanning period Ts=5.15 μsec), Td may be set to about 32 μsec, so that Tmd is 16 to 12 μsec and Tmi is 10 to 14 μsec. Thus the output transistor is driven sufficiently stably in spite of the variations of the elements or temperature. The recent trend of the display unit is, however, toward a higher resolution with the horizontal deflection frequencies of 24 KHz and 31 KHz already realized and the demand is now for the frequencies of 50 KHz and 63 KHz. If the conventional horizontal deflection circuit is used with different circuit constants, only the values of Tr and Ts are reduced and the values and variations of the storage time of the horizontal output transistor $T_{OST}$ and the storage time of the horizontal drive transistor $T_{DST}$ substantially remain unchanged. The values of Tmd and Tmi are thus reduced greatly. As a result, in order to prevent the variations between the elements, highly accurate selection is required on the one hand and the development of elements with small change of $T_{OST}$ and $T_{DST}$ is necessary on the other hand.

Accordingly, it is an object of the present invention to provide a horizontal deflection circuit in which the above-mentioned disadvantage of the conventional circuit is obviated and the horizontal deflection is made possible with a high frequency by the parts including semiconductors used widely.

According to the present invention, there is provided a horizontal deflection circuit comprising variable pulse generator means in which the generation of a pulse is determined by a horizontal oscillation pulse and the termination of the pulse generated is determined by a control voltage, reference pulse generator means for generating a reference pulse synchronous with a horizontal flyback pulse and delayed by a predetermined time, phase detector means for detecting the phase difference between the reference pulse and the collector voltage of a horizontal drive transistor, and supply means for supplying the output of the phase detector means to the variable pulse generator means as a control voltage, so that the time point of reversal of the operation of the horizontal output transistor determining the starting time point of conduction of the horizontal output transistor is maintained stably at a time point a predetermined time after the horizontal flyback pulse.

The present invention will be apparent from the following detailed description taken in conjunction with the accompanying drawings, in which.

Figure 1:
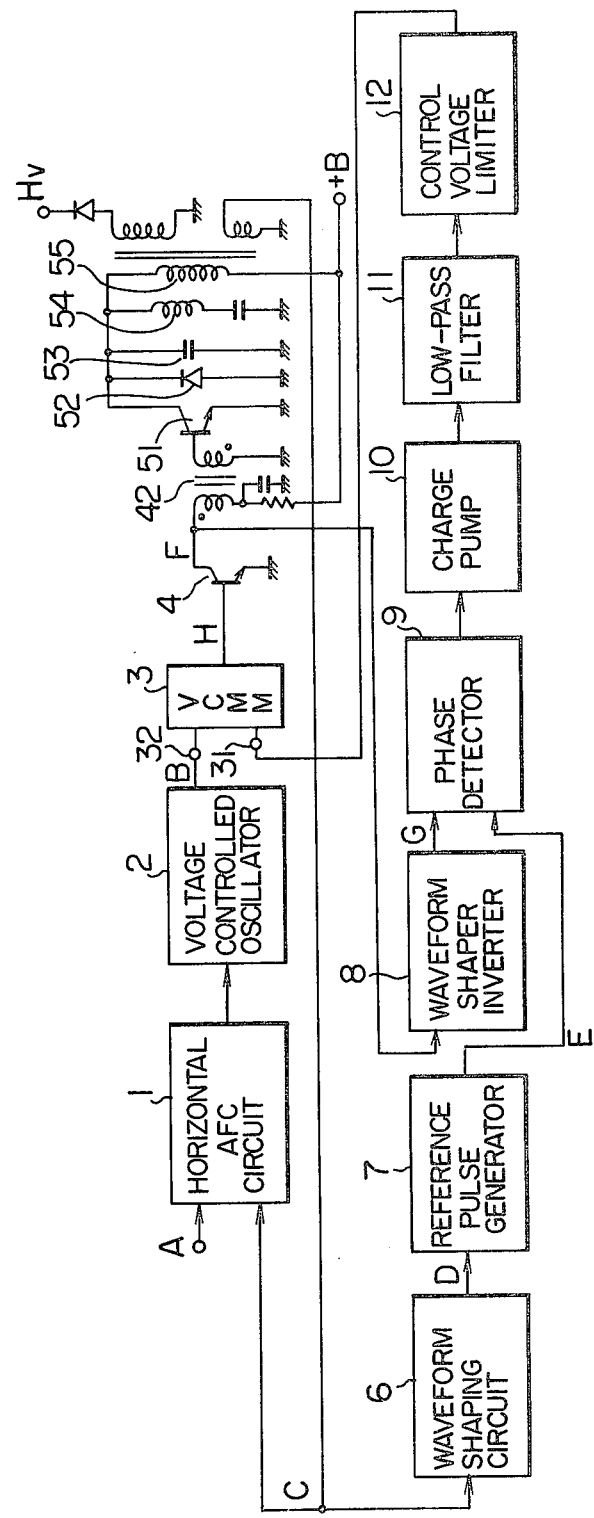
FIG. 1 is a block diagram showing an embodiment of the present invention.
Figure 2:
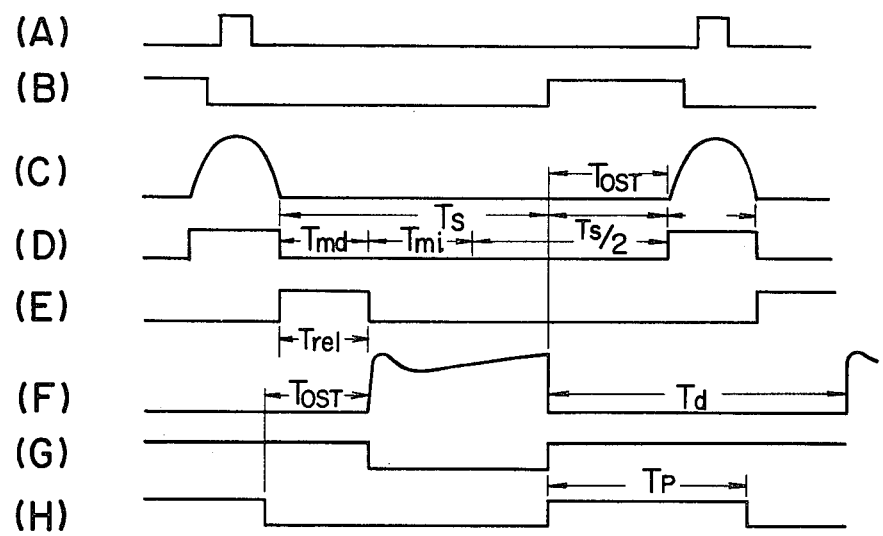
FIG. 2 is a diagram showing voltage waveforms produced at the essential parts of the circuit of FIG. 2.

In FIG. 1, a horizontal AFC circuit 1 supplies a control voltage corresponding to the phase difference between a horizontal sync signal ((A) in FIG. 2) and the horizontal flyback pulse ((C) in FIG. 2) from a flyback transformer 55 to a voltage controlled oscillator 2 thereby to control the oscillation frequency of the oscillator 2, whereby the horizontal oscillation pulse ((B) in FIG. 2) is synchronized with a horizontal sync signal. A voltage controlled monostable multivibrator 3 generates a pulse ((H) in FIG. 2) which is triggered at the leading edge of the horizontal oscillation pulse supplied to a terminal 32 and falls in accordance with the DC voltage applied to a terminal 31, thereby driving a horizontal drive transistor 4. The pulse voltage shown by (F) in FIG. 2 is generated at the collector of the horizontal drive transistor 4, the storage time $T_{DST}$ of the horizontal drive transistor 4 being the time lag from the fall point of the pulse (H) in FIG. 2 to the leading edge of the pulse (F) in FIG. 2. The drive voltage shown in (F) in FIG. 2 is reversed by a drive transformer 42 and applied to a horizontal output transistor 51, so that the horizontal deflection and high voltage generation are effected by the turning on and off of the horizontal output transistor 51. Numeral 52 designates a damper diode, numeral 53 a resonance capacitor, and numeral 54 a horizontal deflection coil. The period from the fall point in (F) in FIG. 2 to the leading edge of the flyback pulse of (C) in FIG. 2 provides the storage time of the horizontal output transistor 51.

The drive pulse ((F) in FIG. 2) from the drive transistor 4 is waveform-shaped by a waveform shaping circuit doubling as an inverter 8 into a waveform shown in (G) in FIG. 2. The flyback pulse ((C) in FIG. 2) is shaped into the waveform shown in (D) in FIG. 4 by the waveform shaping circuit 6, and the fall of this pulse causes the reference pulse generator circuit 7 to produce a pulse of Tref in duration ((E) in FIG. 2). (This pulse may be obtained alternatively by delaying the pulse of (D) in FIG. 2 by the period Tref.) The period Tref is determined in such a manner that the fall of this pulse occurs at a point intermediate between the point of termination of the flyback pulse and the termination of the damper current. Specifically, if the voltage controlled monostable multivibrator (VCMM) 3 is controlled by the phase detector 9, charge pump 10 and the low-pass filter 11 in such a way that the fall of the output ((G) in FIG. 2) of the inverter 8 always coincide with the fall of the pulse of Tref in duration, stable horizontal deflection is performed with Tmd fixed to Tref and Tmi fixed to (Ts/2 - Tmd) regardless of the variations of the storage times $T_{DST}$ and $T_{OST}$.

The output voltage of the low-pass filter 11 is determined as described below.

The time point when the collector voltage of the drive transistor 4 ((F) in FIG. 2) is required to rise is substantially at the middle point (Tmd to Tmi) of the period Tmd+Tmi ($\lesssim T_s/2$) following the termination of the flyback pulse. This middle time point is assumed to be the time Tref ($\approx$Ts/4) later than the termination of the flyback pulse. The displacement of the fall points of the waveforms shown in (E) and (G) in FIG. 2 is detected by the phase detector 9 and the detection output thereof is converted into the direct current by the charge pump circuit 10 and the low-pass filter 11 thereby to produce a DC voltage corresponding to the phase difference. When the leading edge of the collector voltage of the drive transistor 4 (that is, the fall of the waveform G) comes later than the fall of the waveform of (B) in FIG. 2, the DC voltage is reduced, whereas when the phase relation is opposite, the DC voltage increases. The monostable multivibrator 3 is set in such a way that with the decrease of the control voltage applied to the control terminal 31, the pulse duration is shortened, whereas with the increase of the control voltage, the pulse duration is lengthened. In response to the DC voltage supplied to the control terminal 31, therefore, the rise of the collector voltage of the drive transistor 4 is delayed by the period Tref from the point of termination of the flyback pulse regardless of the variations of the storage time $T_{OST}$ or $T_{DST}$ among the elements or with the rise of temperature.

Figure 3:
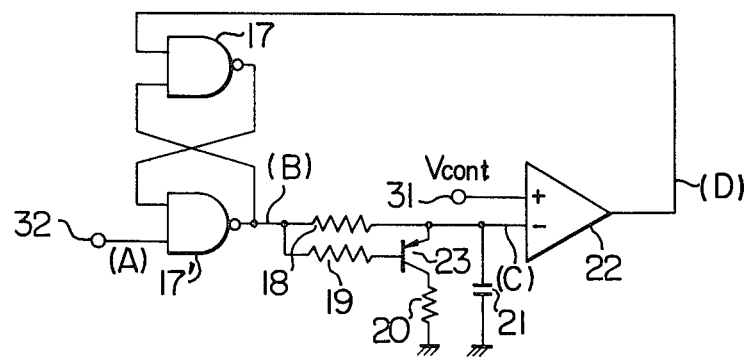
FIG. 3 is a circuit diagram showing an example of the monostable multivibrator of voltage regulation type in FIG. 1.
Figure 4:
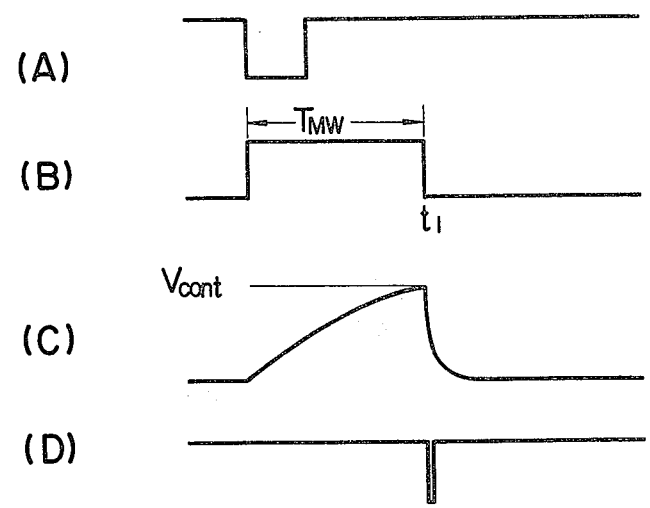
FIG. 4 shows voltage waveforms produced at the essential parts in FIG. 3.

FIG. 3 shows a circuit diagram showing a specific example of the monostable multivibrator 3 of voltage control type in FIG. 1, and FIG. 4 shows waveforms of various signals in FIG. 3.

In FIG. 3, numerals 17 and 17' designate NAND gates, numerals 18 to 20 resistors, numeral 21 a capacitor, numeral 22 a comparator, and numeral 23 a transistor. After the lapse of sufficient time with the input terminal 11D maintained logically at high level ("high"), the point B is settled at "low", point C at "low" and point D at "high". The output D of the comparator 22 is assumed to be "high" when Vcont>Vc (where Vcont is the voltage at the terminal 32 and Vc the voltage across the capacitor 21). When the pulse shown in (A) in FIG. 4 is applied to the terminal 110, the fall thereof triggers the circuit, so that the output waveform B is raised to "high" and the capacitor 21 (with the value of C) is charged through the charge resistor 18 (with the value of R1). Under this condition, the terminal voltage Vc of the capacitor 21 is given as $$Vc = V_B \left( 1 - e^{-\frac{1}{CR1}t} \right),$$

where VB is the voltage at point B when it is "high". The transistor 23 is cut off, and the charging operation of the capacitor 21 continues until Vc becomes Vcont.

The value of Vc=Vcont is assumed to be attained at the time t₁. With a little advance of time from t₁, Vc exceeds Vcont and the output D of the comparator 22 is reduced to "low". Specifically, the input terminal 17B of the NAND gate 17 shown by 17 is raised to "high", while the output terminal 17C thereof is lowered to "low" state. The output terminal 17C of the NAND gate 17 is thus raised to "high". As a result, the input terminal 17'A of the NAND gate 17' is raised to "high" (The second input terminal of NAND gate 17' namely, the terminal 32 is raised to "high" immediately after being reduced to "low" by the trigger. In other words, the second input terminal of the NAND gate 17' is raised to "high" at least before the output D is reduced to "low".) The output B of the NAND gate 17 is reduced to "low". As a result, the charging of the capacitor 21 is stopped, and the base current of the transistor 23 flows through the resistor 19, so that the transistor 23 conducts, thus discharging the charges of the capacitor 21 through the discharge resistor 20 (with the value of R2), so that the terminal voltage C of the capacitor 21 becomes $$Vc = Vcont \, e^{-\frac{1}{CR2}(t-t_1)}.$$

In this way, immediately after the starting of the discharge, the Vc is reduced below Vcont and the output D of the comparator 22 is raised to "high", thus restoring the initial conditions. The pulse duration at point B as related to the control voltage Vcont is thus given as $$T_{MW} = CR_1 \ln \left( \frac{1}{1 - \frac{Vcont}{V_B}} \right),$$

and the circuit shown in FIG. 3 may be used as the monostable multivibrator 3 of voltage controlled type shown in FIG. 1.

Figure 5:
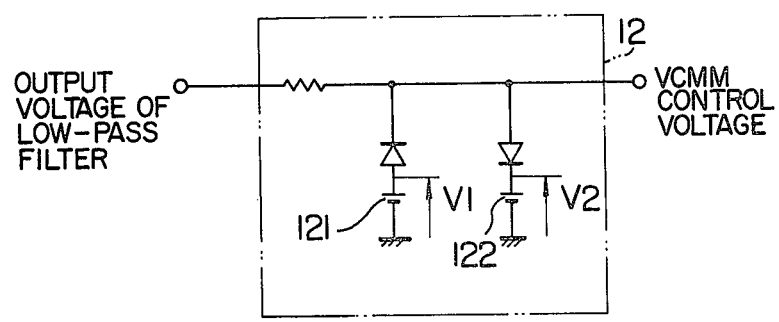
FIG. 5 is a circuit diagram showing an example of a control voltage limiter circuit included in FIG. 1.

In this monostable multivibrator of voltage controlled type 3, the relation between the control voltage and the duration of the output pulse is linear, and therefore the duration of the output pulse may be shortened extremely, thus making normal operation impossible, under transient conditions such as when power is thrown in. In order to prevent such inconveniences, a control voltage limiter circuit 12 as shown in FIG. 5 is inserted between the low-pass filter 11 and the control terminal 31 for preventing the great variations of the duration of the output pulse under transient conditions. Also, the circuit 12 always maintain the control voltage between the voltage V₁ of the DC power supply 121 and the voltage V₂ of the DC power supply 12, and therefore by neglecting the asymmetric control range of the rise of the collector voltage ((F) in FIG. 2) (that is, by displacing the central voltage from V₁+V₂/ 2), the deflection frequency may be increased.

The setting accuracy of the period Tref is such that, if the horizontal frequency is assumed to be 63 KHz, Tmd+Tmi is about 6.5 μsec, and the error of the setting accuracy of the rise point of the drive transistor of a about ±1 μsec is sufficiently tolerable, so that if Tmd=Tmi, Tref=3.25μ±1 μsec. This is a value sufficiently realizable by use of an ordinary part (delay element) having no special accuracy.

It will be understood from the foregoing description that according to the present invention, the rise point of the drive transistor is controlled always most properly regardless of the storage time of the drive transistor or the variations thereof among transistor elements or the change thereof with temperature increase, and therefore the horizontal deflection frequency is capable of being increased.

We claim:

1. A horizontal deflection circuit comprising:

horizontal oscillator means;

horizontal drive means including a horizontal drive transistor turned on and off by an output pulse from said horizontal oscillator means;

horizontal output means including a horizontal output transistor turned on and off by an output pulse from said horizontal drive means;

variable pulse generator means including a first input terminal connected to said horizontal oscillator means, an output terminal connected to said horizontal drive means, and a second input terminal, said variable pulse generator means generating at said output terminal a pulse synchronous with the pulse applied to said first input terminal and terminated at a time point determined in accordance with a DC voltage applied to said second input terminal;

reference pulse generator means connected to said horizontal output means for generating a reference pulse delayed from a horizontal flyback pulse by a predetermined time;

phase detector means for detecting the phase difference between the drive pulse generated at the collector of said horizontal exciting transistor and the reference pulse, and control means for supplying said second input terminal of said variable pulse generator means with a voltage converted into direct current from the output of said detector means in a direction to dampen the variations of the drive pulse.

2. A horizontal deflection dircuit according to claim 1, wherein said control means includes a charge pump for generating a selected one of the voltage and current corresponding to the output of said phase detector means.

3. A horizontal deflection circuit according to claim 1 or 2, wherein said control means includes limiter means for limiting the variation of the DC voltage supplied to said second input terminal within a predetermined range.

4. A horizontal deflection circuit according to claim 3, wherein said predetermined time is determined in such a manner that said reference pulse is generated at a middle point betwen the termination of said horizontal flyback pulse and the termination of the damper current.

5. A horizontal deflection circuit according to claim 1 or 2, wherein said predetermined time is determined in such a manner that said reference pulse is generated at a middle point between the termination of said horizontal flyback pulse and the termination of the damper current.

* * * * *